United States Patent
Li et al.

(10) Patent No.: US 11,450,692 B2
(45) Date of Patent: Sep. 20, 2022

(54) ARRAY SUBSTRATE AND DISPLAY SCREEN

(71) Applicant: Yungu (Gu'an) Technology Co., Ltd., Hebei (CN)

(72) Inventors: Yang Li, Kunshan (CN); Yinghai Ma, Kunshan (CN); Feng Yu, Kunshan (CN); Xiaojia Liu, Kunshan (CN); Jiuzhan Zhang, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 17/218,719

(22) Filed: Mar. 31, 2021

(65) Prior Publication Data

US 2021/0217780 A1     Jul. 15, 2021

Related U.S. Application Data

(63) Continuation of application No. PCT/CN2019/100924, filed on Aug. 16, 2019.

(30) Foreign Application Priority Data

Feb. 25, 2019    (CN) .......................... 201910137391.4

(51) Int. Cl.
*H01L 27/12*    (2006.01)

(52) U.S. Cl.
CPC ...... *H01L 27/1244* (2013.01); *H01L 27/1248* (2013.01)

(58) Field of Classification Search
None
See application file for complete search history.

(56) References Cited

U.S. PATENT DOCUMENTS

2003/0206332 A1* 11/2003 Yamazaki ........... H01L 51/5253
                                                    359/312
2004/0263740 A1* 12/2004 Sakakura .............. H01L 27/124
                                                    349/138

(Continued)

FOREIGN PATENT DOCUMENTS

CN          1578546 A     2/2005
CN        101136389 A     3/2008

(Continued)

OTHER PUBLICATIONS

Examination Report dated May 27, 2020 of corresponding Chinese application No. 201910137391.4; 7 pages.

(Continued)

*Primary Examiner* — Bo B Jang
(74) *Attorney, Agent, or Firm* — Maier & Maier, PLLC (57) ABSTRACT

An array substrate and a display screen, where the array substrate includes a display area and a wiring area located on one side of the display area, the wiring area includes an upper wiring layer and a lower wiring layer laminated with the upper wiring layer, the upper wiring layer and the lower wiring layer are separated by an insulating layer group, the insulating layer group includes an insulating sub-layer and an insulating organic compensator formed on the insulating sub-layer, the insulating organic compensator is configured to compensate for at least part of a recess on an upper surface of the insulating sub-layer.

17 Claims, 4 Drawing Sheets

(56) References Cited

U.S. PATENT DOCUMENTS

2011/0272702 A1    11/2011  Kwon et al.
2015/0194443 A1*    7/2015  Chen ................. H01L 29/78645
                                                        438/151

FOREIGN PATENT DOCUMENTS

| CN | 102548189 A | 7/2012 |
| CN | 104777692 A | 7/2015 |
| CN | 105448933 A | 3/2016 |
| CN | 108269836 A | 7/2018 |
| CN | 108305881 A | 7/2018 |
| CN | 108400101 A | 8/2018 |
| CN | 109768054 A | 5/2019 |
| JP | 3351774 B2 | 12/2002 |

OTHER PUBLICATIONS

International Search Report dated Oct. 30, 2019 in corresponding International application No. PCT/CN2019/100924; 6 pages.

\* cited by examiner

ARRAY SUBSTRATE AND DISPLAY SCREEN

CROSS-REFERENCE TO RELATED APPLICATIONS

This application is a continuation application of the International application PCT/CN2019/100924, filed on Aug. 16, 2019, which claims priority to Chinese patent application No. 201910137391.4 filed on Feb. 25, 2019. Both applications are hereby incorporated by reference in their entireties.

TECHNICAL FIELD

The present disclosure relates to the field of display technologies, and particularly to an array substrate and a display screen.

BACKGROUND

With the rapid development of display technologies, a display screen with a high screen-to-body ratio is becoming more and more popular. Currently, a more commonly used display screen targets at disposing a fan out area, a bending area, a pad area and a chip on the same side of the display screen without disposing the fan out area, the bending area or the pad area on the other three sides, thereby achieving a high screen-to-body ratio.

In the above-mentioned display screen, the fan out area has multi-layer wirings, where the multi-layer wirings are insulatively separated by an insulating layer, and when the insulating layer has defects such as a recess or a gap, etc., these defects may affect display effects of the display screen.

SUMMARY

Embodiments of the present disclosure provide an array substrate and a display screen, for solving the problem that the display screen has a poor display effect.

To achieve the above purpose, in one aspect, an embodiment of the present disclosure provides an array substrate, which includes a display area and a wiring area located on one side of the display area,
where the wiring area includes an upper wiring layer and a lower wiring layer laminated with the upper wiring layer, the upper wiring layer and the lower wiring layer are separated by an insulating layer group,
the insulating layer group includes an insulating sub-layer and an insulating organic compensator formed on the insulating sub-layer, and the insulating organic compensator is configured to compensate for at least part of a recess on an upper surface of the insulating sub-layer.

Compared to the prior art, the array substrate provided in an embodiment of the present disclosure has following advantages.

In the array substrate provided in the embodiment of the present disclosure, the insulating organic compensator is disposed on the insulating sub-layer, and the insulating organic compensator is used to fill the recess of the insulating sub-layer, thus capable of preventing a metal for forming the upper wiring layer from entering into the recess of the insulating sub-layer, therefore, it is able to avoid occurrence of a problem that there is difficulty in removing the metal in the recess, hence avoiding a short circuit phenomenon resulting from the situation that the metal for forming the upper wiring layer retains in the recess, thereby reducing the adverse effect on the array substrate, and improving the yield of the array substrate and the display effect of the narrow frame display screen.

In another aspect, an embodiment of the present disclosure provides a display screen, which includes a chip and the aforementioned array substrate.

In addition to the above-described technical problems to be solved in the embodiments of the present disclosure, the technical characteristics that constitute the technical solutions and the beneficial effects that the technical characteristics of the technical solutions bring, other technical problems that can solved by the array substrate and the display screen provided in the embodiments of the present disclosure, other technical characteristics included in the technical solutions and beneficial effects that the technical characteristics bring will be further described in detail in the embodiment section.

DETAILED DESCRIPTION OF THE EMBODIMENTS

In order to solve the problem that the display screen has a poor display effect, the embodiments of the present disclosure provide an array substrate and a display screen, where the array substrate includes a display area and a wiring area located on one side of the display area, the wiring area includes an upper wiring layer and a lower wiring layer laminated with the upper wiring layer, the upper wiring layer and the lower wiring layer are separated by an insulating layer group, the insulating layer group includes an insulating sub-layer and an insulating organic compensator formed on the insulating sub-layer, and the insulating organic compensator is configured to compensate for at least part of a recess on the upper surface of the insulating sub-layer. In the embodiments of the present disclosure, the insulating organic compensator is disposed on the insulating sub-layer, and the insulating organic compensator is used to fill the recess of the insulating sub-layer, thus capable of preventing a metal for forming the upper wiring layer from entering into the recess of the insulating sub-layer, therefore, it is able to avoid occurrence of a problem that there is difficulty in removing the metal in the recess, hence avoiding a short circuit phenomenon resulting from the situation that the metal for forming the upper wiring layer retains in the recess, thereby reducing the adverse effect on the array substrate, and improving the yield of the array substrate and the display effect of the narrow frame display screen.

In order to make the above-mentioned purpose, features and advantages of the embodiments of the present disclosure more comprehensible, the technical solutions in the embodiments of the present disclosure will be described hereunder clearly and comprehensively in conjunction with the drawings in the embodiments of the present disclosure. Obviously, the described embodiments are only a part of the embodiments of the present disclosure, rather than all embodiments. Based on the embodiments of the present disclosure, all other embodiments obtained by those of ordinary skill in the art without creative work shall fall into the protection scope of the present disclosure.

EMBODIMENT 1

Figure 2:
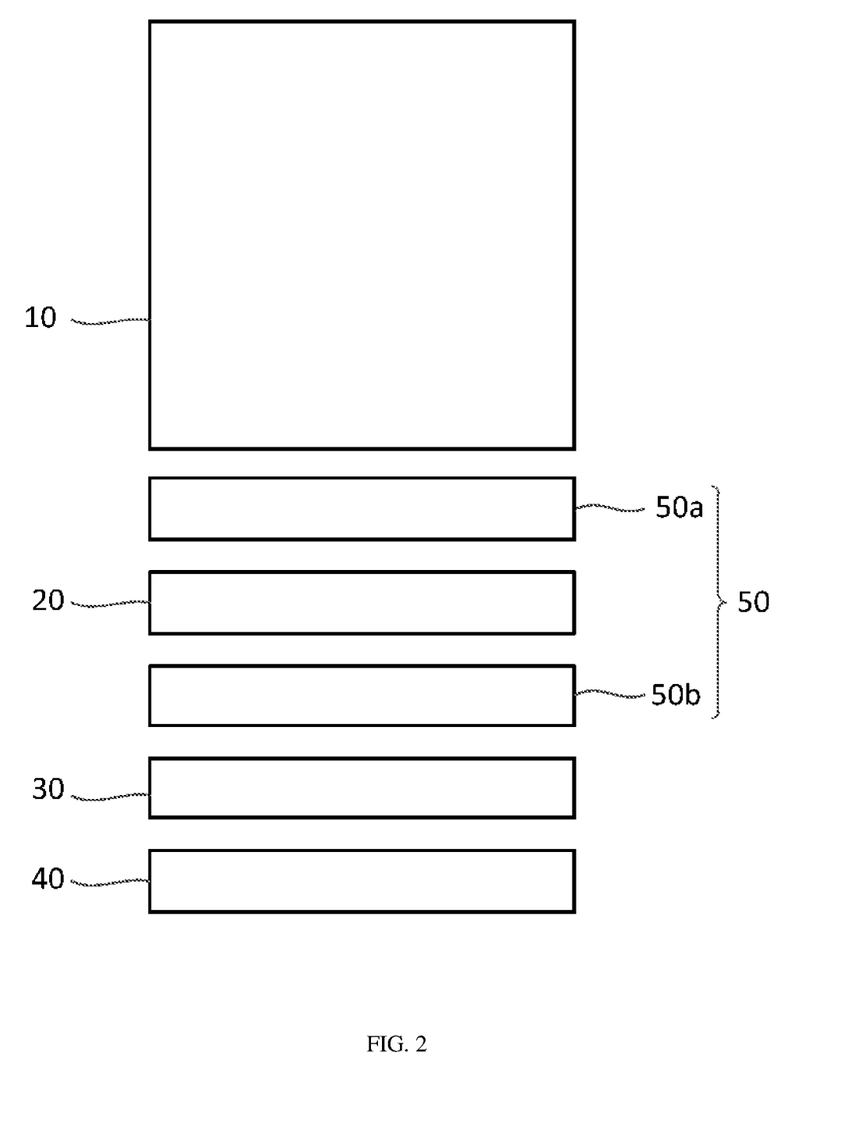
FIG. 2 is a structural schematic diagram of an array substrate and a chip according to an embodiment of the present disclosure.
Figure 3:
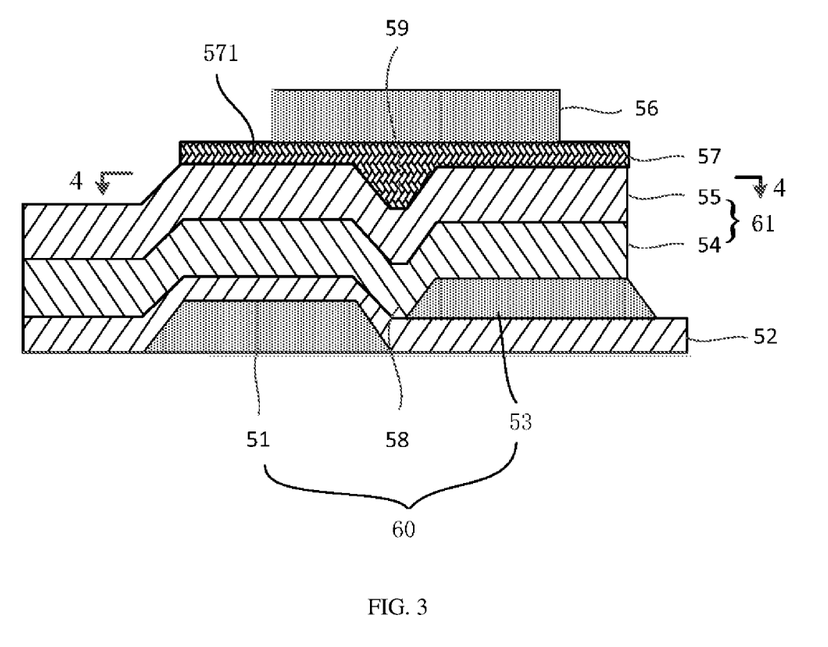
FIG. 3 is a cross-sectional view of a fan out area in FIG. 2.
Figure 4:
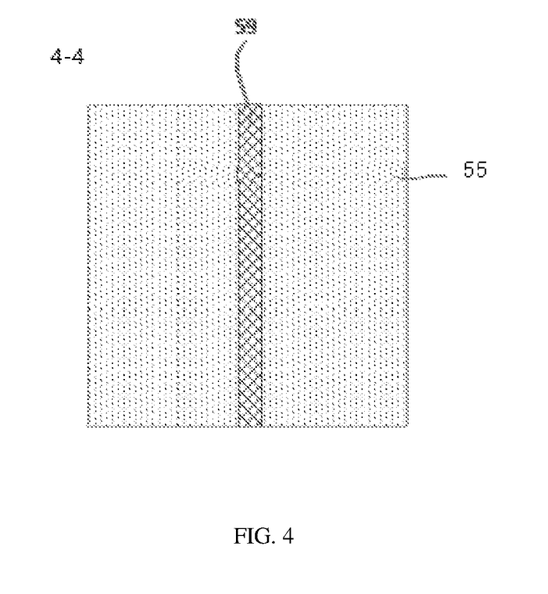
FIG. 4 is a top view of a plane along 4-4 in FIG. 3.

Please refer to FIG. 2-FIG. 4, an embodiment of the present disclosure provides an array substrate, the array substrate includes a display area 10 and a wiring area located on one side of the display area 10, the wiring area includes an upper wiring layer 56 and a lower wiring layer 60 laminated with the upper wiring layer, the upper wiring layer 56 and the lower wiring layer 60 are separated by an insulating layer group, the insulating layer group includes an insulating sub-layer 61 and an insulating organic compensator 57 formed on the insulating sub-layer 61, and the insulating organic compensator 57 is configured to compensate for at least part of a recess on the upper surface of the insulating sub-layer 61.

The upper wiring layer 56 is formed above the insulating layer group, when the upper surface of the insulating layer group has defects such as a recess or a gap, etc., the display effect of the display screen may be affected. In the present embodiment, the insulating layer group includes the insulating sub-layer 61 and the insulating organic compensator 57, where the insulating organic compensator 57 is located between the upper wiring layer 56 and the insulating sub-layer 61. When there is a recess on the upper surface of the insulating sub-layer 61, the insulating organic compensator 57 can compensate for the recess, thereby providing a flat formation surface for the upper wiring layer 56, thus reducing or avoiding the influence on the display effect.

There are many reasons for the formation of the recess on the upper surface of the insulating sub-layer 61, for example, when the insulating sub-layer is formed via a chemical vapor deposition (CVD) process, due to the poor flatness of the substrate under the insulating sub-layer 61, the upper surface of the insulating sub-layer 61 is not flat; for another example, since errors exist in the deposition process, a gap or a recess appears on the upper surface of the insulating sub-layer 61. In the present embodiment, description is made with an example where the upper surface of the insulating sub-layer 61 is not flat due to the poor flatness of the substrate under the insulating sub-layer 61.

Figure 1:
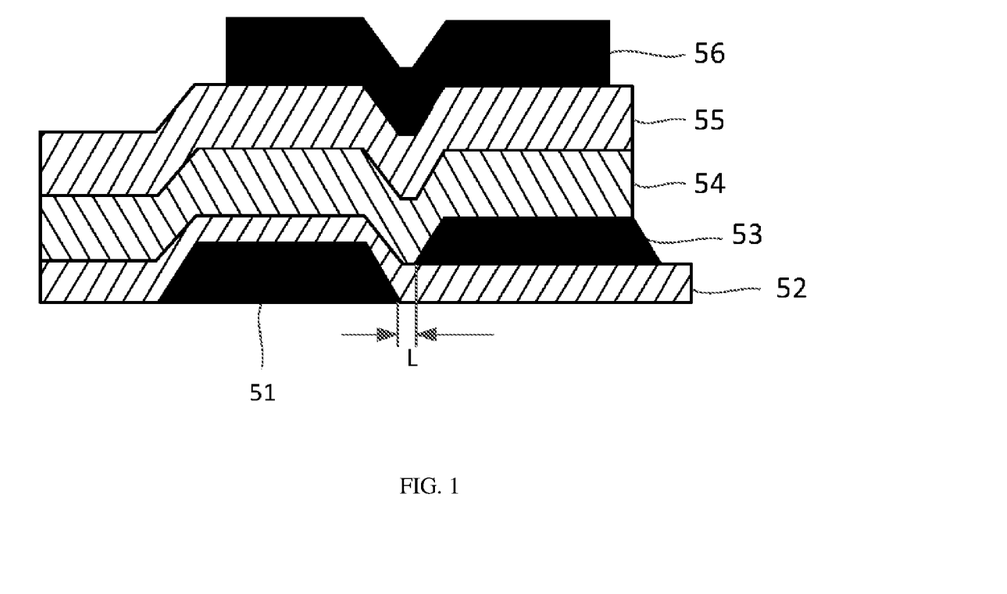
FIG. 1 is a structural schematic diagram of an array substrate.

For the array substrate as shown in FIG. 1, the array substrate includes the lower wiring layer 60, the insulating sub-layer 61, and the upper wiring layer 56 in a sequentially laminated arrangement. In the display screen, especially a narrow frame display screen, the lower wiring layer 60 includes multiple wiring layers, because the spacing L between the multiple wiring layers is small, and usually the spacing L is less than or equal to 1 μm, plus each wiring layer has a different thickness, there is an obvious gap between the wiring layers. When the insulating sub-layer 61 is formed above the lower wiring layer 60 via a chemical vapor deposition process, a recess is formed at a part of the insulating sub-layer 61 corresponding to the above-mentioned gap; when a metal layer is formed above the insulating sub-layer 61 via a physical vapor deposition (PCD) process, metal powders will enter into the recess, when the upper wiring layer 56 is formed by etching the metal layer, it is difficult to etch or remove the metal in the recess, resulting in metal retention in the recess, rendering that the wirings of the upper wiring layer 56 formed by etching the metal layer are easily short-circuited.

In the present embodiment, by disposing the insulating organic compensator 57 above the insulating sub-layer 61 to compensate for the recess, thereby the wirings in the upper wiring layer 56 are prevented from being short-circuited in the above-mentioned recess. FIG. 3 is a structural schematic view of the array substrate corresponding to a fan out area 50 in the present embodiment, as shown in FIG. 3, the wiring area includes the upper wiring layer 56 and the lower wiring layer 60 in a sequentially laminated arrangement, the insulating layer group includes the insulating organic compensator 57 and the insulating sub-layer 61 which are located between the upper wiring layer 56 and the lower wiring layer 60 and are in a sequentially laminated arrangement. Specifically, the insulating sub-layer 61 includes multiple dielectric layers, for example the dielectric layers may be two layers, as shown in FIG. 3, the insulating sub-layer 61 includes a first dielectric layer 54 and a second dielectric layer 55 which are laminatedly disposed.

In the present embodiment, the insulating organic compensator 57 is configured to compensate for at least part of a recess on the upper surface of the insulating sub-layer 61. Specifically, the insulating organic compensator 57 may be formed in the above-mentioned recess and an area at a periphery of the above-mentioned recess, or may be formed in the above-mentioned recess alone, the insulating organic compensator 57 may be formed by liquid solidification, for example, can be configured as colloid, a self-leveling principle is used to fill the recess, thus providing a flat surface for the upper wiring layer 56.

In addition, the array substrate further includes a bending area 20, a pad area 30, and a fan out area 50; the wiring area may be disposed within the fan out area 50. Taking the orientation of the array substrate shown in FIG. 2 as an example, in the present embodiment, the bending area 20, the pad area 30 and the fan out area 50 are located beneath the display area 10. There may be multiple fan out areas 50 in the present embodiment, and the number of the fan out areas 50 is not specifically limited in the present embodiment.

In summary, for the array substrate provided in the embodiment of the present disclosure, the insulating organic compensator 57 is disposed on the insulating sub-layer 61, and the insulating organic compensator 57 can fill the recess on the upper surface of the insulating sub-layer 61, thereby preventing a metal for the upper wiring layer 56 from entering into the recess of the insulating sub-layer 61, therefore, it is able to avoid occurrence of a problem that there is difficulty in removing the metal in the recess, hence avoiding a short circuit phenomenon in the upper wiring layer 56 due to metal retention in the recess, thereby reducing the adverse effect on the array substrate, and improving the yield of the array substrate and the display effect of the narrow frame display screen.

In a possible implementation, the insulating organic compensator 57 is organic adhesive. Specifically, when the insulating organic compensator 57 is configured as organic adhesive, the organic adhesive can fill the recess of the insulating sub-layer 61 during a flowing process, avoiding subsequent residue resulting from the situation that the metal for forming the upper wiring layer 56 penetrates into the recess. Further, the organic adhesive can be polyimide adhesive, or acrylate diester anaerobic adhesive.

In a possible implementation, the insulating organic compensator 57 covers the insulating sub-layer 61. In the present embodiment, the insulating organic compensator 57 may cover the entire upper surface of the insulating sub-layer 61, or may cover a part of the upper surface of the insulating sub-layer 61.

Further, as shown in FIG. 3, the lower wiring layer 60 includes a first wiring sub-layer 51, a second wiring sub-layer 53, and an insulating interlayer 52 configured to separate the first wiring sub-layer 51 and the second wiring sub-layer 53, a first recess area 58 is formed between a partial area of the insulating interlayer 52 and the second wiring sub-layer 53, a second recess area 59 is formed in a partial area of the upper surface of the insulating sub-layer 61, and the insulating organic compensator 57 includes a filling part filled in the second recess area 59.

In the present embodiment, there are multiple first wirings in the first wiring sub-layer 51, and the multiple first wirings are arranged on the array substrate, for example, arranged with equal spacing and parallel to each other on the array substrate. The insulating interlayer 52 is disposed above the first wiring sub-layer 51, the second wiring sub-layer 53 is disposed above the insulating interlayer 52, the insulating interlayer 52 in the present embodiment is configured to separate the first wiring sub-layer 51 and the second wiring sub-layer 53, preventing the first wiring sub-layer 51 and the second wiring sub-layer 53 from being short-circuited due to their contact. Because there is a gap between the first wiring sub-layer 51 and the second wiring sub-layer 53, the first recess area 58 is formed between the insulating interlayer 52 and the second wiring sub-layer 53.

There are multiple second wirings in the second wiring sub-layer 53, and the multiple second wirings are arranged on the insulating interlayer 52, for example, arranged with equal spacing and parallel to each other on the insulating interlayer 52. The insulating sub-layer 61 is formed above the second wiring sub-layer 53 and the insulating interlayer 52, therefore, the second recess area 59 is formed on the upper surface of the insulating sub-layer 61 at a part corresponding to the above-mentioned first recess area 58, and the insulating organic compensator 57 includes the filling part located in the second recess area 59, which is configured to compensate for the second recess area 59.

As shown in FIG. 3 and FIG. 4, the insulating interlayer 52 covers the first wiring sub-layer 51, and a protrusion is formed at a part corresponding to the first wiring sub-layer 51; the first recess area 58 is formed between the protrusion and the second wiring sub-layer 53; the insulating sub-layer 61 covers the insulating interlayer 52, the first recess area 58, and the second wiring sub-layer 53, and the second recess area 59 is formed at a part of the insulating sub-layer 61 corresponding to the first recess area 58. On the basis of the above-described implementations, the insulating sub-layer 61 further includes a flat area located at a periphery of the second recess area 59, and the insulating organic compensator 57 further includes a flat sub-layer 571 extending to a surface of the flat area. In the present implementation, the insulating organic compensator 57 not only includes the filling part filled in the second recess area 59, but also includes the flat sub-layer 571 covering the insulating sub-layer 61. Such arrangement is convenient for making the insulating organic compensator 57 using a self-leveling principle, and filling the second recess area 59 more accurately.

In a possible implementation, the insulating sub-layer 61 is a two-layer lamination including a silicon oxide layer and a silicon nitride layer. For example, the insulating sub-layer 61 can be one or more dielectric layers, specifically, the insulating sub-layer 61 includes the first dielectric layer 54 and the second dielectric layer 55, where the first dielectric layer 54 is a silicon oxide layer, and the second dielectric layer 55 is a silicon nitride layer. Specifically, as shown in FIG. 3, the dielectric layer in the present embodiment is configured with two layers, the first dielectric layer 54 is disposed above the second wiring sub-layer 53, the second dielectric layer 55 is disposed above the first dielectric layer 54, the first dielectric layer 54 can be configured as a silicon oxide layer, the second dielectric layer 55 can be configured as a silicon nitride layer, in addition, the first dielectric layer 54 can also be configured as a silicon nitride layer, and the second dielectric layer 55 can also be configured as a silicon oxide layer.

The hierarchical structure of the array substrate is not limited to the above-mentioned hierarchical structure, layer addition or deletion is possible as required, also any one or more of the above layers can be selected as required, and the arrangement order of the above-mentioned layers is not limited to the arrangement order shown in FIG. 3.

In a possible implementation, the array substrate includes a fan out area 50 on one side of the display area 10, and the wiring area is located in the fan out area 50. Specifically, the fan out area 50 includes a first fan out area 50a and a second fan out area 50b which are spaced apart, and at least one of the bending area 20 and the pad area 30 is disposed between the first fan out area 50a and the second fan out area 50b. The number of fan out areas 50 can also be three, four or five, and the number of the fan out areas 50 is not specifically limited in the present embodiment. With respect to the sequence, there are many ways to arrange the bending area 20 and the pad area 30, for example, both the bending area 20 and the pad area 30 can be arranged between the first fan out area 50a and the second fan out area 50b, for another example, one of the bending area 20 and the pad area 30 is disposed between the first fan out area 50a and the second fan out area 50b.

Further, on the basis of the above implementations, the bending area 20 is disposed between the first fan out area 50a and the second fan out area 50b. As shown in FIG. 2, in the present embodiment, the bending area 20 is disposed between the first fan out area 50a and the second fan out area 50b, and the pad area 30 is disposed on a side of the second fan out area 50b facing away from the bending area 20.

In a possible implementation, the first wiring sub-layer 51 and a gate layer of the display area 10 are disposed in a same layer, and the insulating interlayer 52 and a gate insulating layer of the display area 10 are disposed in a same layer. In another word, the first wiring sub-layer 51 and the gate layer are formed by the same patterning process, and the insulating interlayer 52 and the gate insulating layer are formed by the same patterning process, so as to reduce the number of mask plates in an array substrate preparation process. A further film layer of the fan out area and a corresponding film layer of the display area are also disposed in the same layer, for example, the dielectric layer of the fan out area and the dielectric layer of the display area may be disposed in the same layer.

Figure 5:
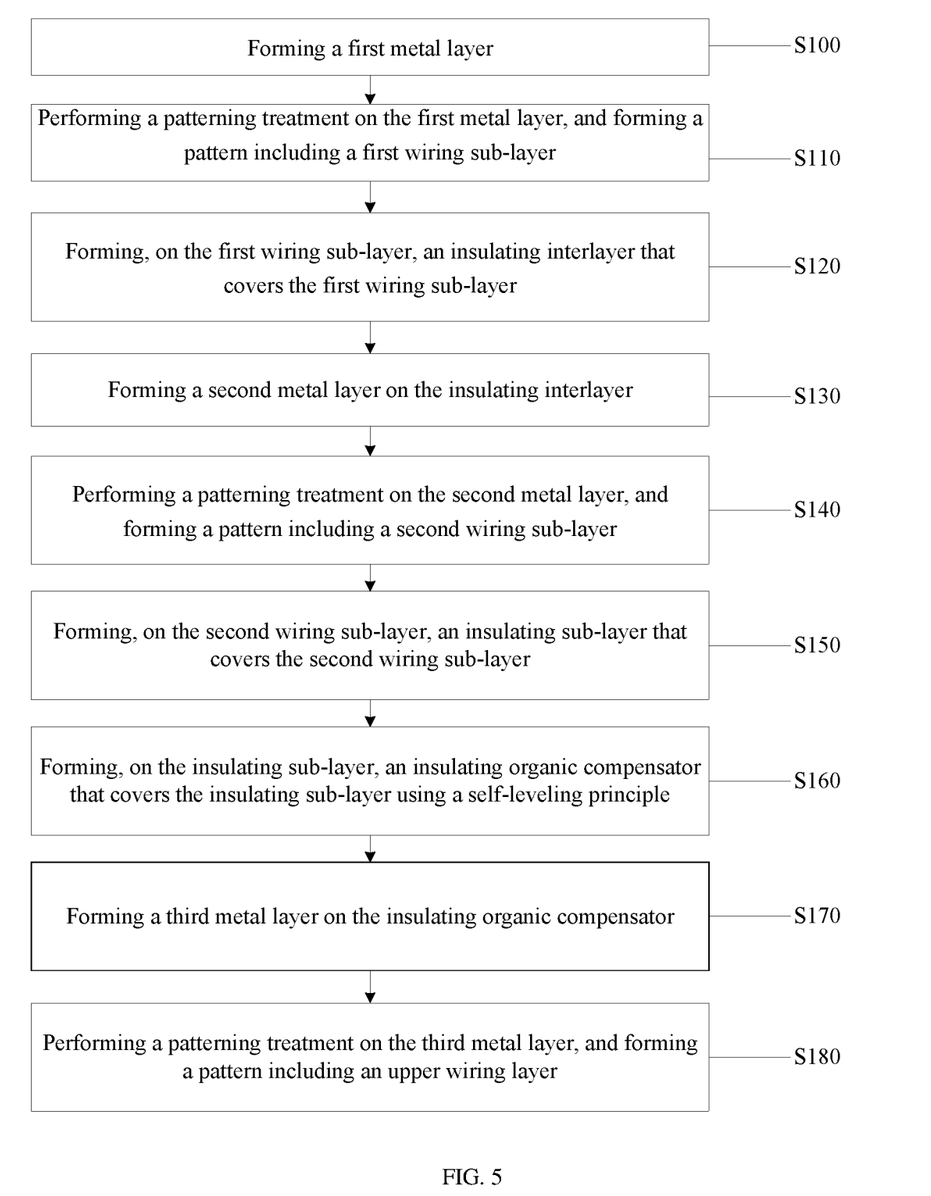
FIG. 5 is a flowchart of a preparation method of an array substrate according to an embodiment of the present disclosure.

Please refer to FIG. 5, a preparation method of the array substrate provided in Embodiment 1 of the present disclosure includes:

S100: Forming a first metal layer;

S110: Performing a patterning treatment on the first metal layer, and forming a pattern including a first wiring sub-layer 51;

S120: Forming, on the first wiring sub-layer 51, an insulating interlayer 52 that covers the first wiring sub-layer 51;

S130: Forming a second metal layer on the insulating interlayer 52;

S140: Performing a patterning treatment on the second metal layer, and forming a pattern including a second wiring sub-layer 53;

S150: Forming, on the second wiring sub-layer 53, an insulating sub-layer 61 that covers the second wiring sub-layer 53;

S160: Forming, on the insulating sub-layer 61, an insulating organic compensator 57 that covers the insulating sub-layer 61 using a self-leveling principle;

S170: Forming a third metal layer on the insulating organic compensator 57; and S180: Performing a patterning treatment on the third metal layer, and forming a pattern including an upper wiring layer 56.

Specifically, FIG. 5 is a flowchart of a preparation method of an array substrate according to an embodiment of the present disclosure, as shown in FIG. 5, in the step of forming the first metal layer in S100, a base substrate usually needs to be pre-provided, such that the first metal layer is formed in a non-display area of the base substrate, specifically, the first metal layer may be formed on the base substrate by means of evaporation, sputtering or physical vapor deposition. In S110 and S140, when a patterning treatment is performed on the first metal layer and the second metal layer, the treatment can be yellow lighting, etching, or a combination thereof. In S120, the insulating interlayer 52 is disposed above the first wiring sub-layer 51 and covers the first wiring sub-layer 51, and the insulating interlayer 52 is configured to separate the first wiring sub-layer 51 and the second wiring sub-layer 53, preventing the short-circuit caused by contact of the two, a mode for formation of the insulating interlayer 52 can be evaporation, sputtering or chemical vapor deposition. In S130, the second metal layer may be formed on the insulating interlayer 52 by means of evaporation, sputtering or physical vapor deposition.

In an implementation, the first metal layer may be formed simultaneously in the display area 10 and a non-display area, where the gate layer is formed after the first metal layer formed on the display area 10 is patterned, and the first wiring sub-layer 51 is formed after the first metal layer formed on the non-display area is patterned.

In S150, the insulating sub-layer 61 can be made of silicon oxide or silicon nitride, the insulating sub-layer 61 can be configured to one or more layers, and the insulating sub-layer 61 covers the second wiring sub-layer 53 so as to separate the second wiring sub-layer 53 and the upper wiring layer 56, and also to provide support for the upper wiring layer 56. In S160, the insulating organic compensator 57 can be made of liquid organic adhesive, and the insulating organic compensator 57 can be filled in the recess of the insulating sub-layer 61 using a self-leveling principle, besides, the insulating organic compensator 57 can also cover the display area 10 of the base substrate. In S170–S180, after the insulating organic compensator 57 is solidified, the third metal layer is formed on the insulating organic compensator 57, and a patterning treatment is performed on the third metal layer, likewise, the patterning treatment can be yellow lighting, etching, or a combination thereof, thereby forming the upper wiring layer 56.

In the preparation method of the array substrate provided in the embodiment of the present disclosure, the insulating organic compensator 57 can fill the recess of the insulating sub-layer 61, providing a flat support surface for subsequent formation of the third metal layer, avoiding the situation that there is difficulty in removing part of metal that enters into the recess when the third metal layer is formed, hence avoiding a short circuit phenomenon resulting from a situation that the metal for forming the upper wiring layer 56 retains in the recess, thereby reducing the adverse effect on the array substrate, and improving the display effect of the narrow frame display screen.

In a possible implementation, the step of performing the patterning treatment on the third metal layer and forming the pattern including the upper wiring layer 56 includes a yellow lighting step and an etching step, where the yellow lighting step includes performing photoresist coating, exposing, and developing on the third metal layer. The etching step in the present embodiment can be dry etching. The dry etching means generating plasma by ionizing specific gas, bombarding a target with the plasma, such that the target generates target particles, and the target particles escape from the target, thereby forming an etching method for a desired pattern.

EMBODIMENT 2

Embodiment 2 of the present disclosure provides a display screen, which includes a chip 40 and the aforementioned array substrate. Further, the chip 40, together with the bending area 20, the pad area 30 and the fan out area 50 of the array substrate, is located on the same side of the display area 10 of the array substrate, and the chip 40 is electrically connected to the display area 10. As shown in FIG. 2, the chip 40 is located on a side where the pad area 30 is located, and the chip 40 is electrically connected to the first wiring sub-layer 51, the second wiring sub-layer 53 and the upper wiring layer 56.

The display screen provided in the present embodiment includes the array substrate provided in Embodiment 1, and therefore has the advantage of the array substrate in Embodiment 1, that is, preventing the metal for forming the upper wiring layer 56 from entering into the recess, thereby preventing the wirings in the upper wiring layers 56 from being short-circuited, thus improving the display effect of the display screen. A display device applied with the narrow frame display screen in the present embodiment can be applied to different products, which for example, may be applied to products such as mobile phones, tablet computers, e-books, etc., and will not be elaborated here.

The embodiments or implementations in the specification are described in a progressive manner, each embodiment focuses on the difference from other embodiments, and the same or similar parts between the embodiments can be referred to each other.

In the specification, specific features, structures or materials described in the embodiments may be combined with each other in a suitable manner.

Finally, it should be noted that the above embodiments are only used to illustrate the technical solutions of the present disclosure, not to limit the technical solutions; although the present disclosure has been described in detail with reference to the foregoing embodiments, those of ordinary skill in the art should understand that they may still make modifications to the technical solutions described in the foregoing embodiments, or make equivalent replacements to some or all technical features therein; however, these modifications or replacements will not make the essence of the corresponding technical solutions depart from the scope of the technical solutions in the embodiments of the present disclosure.

What is claimed is:

1. An array substrate, comprising:
a display area; and
a wiring area located on one side of the display area and comprising an upper wiring layer and a lower wiring layer laminated with the upper wiring layer,
wherein the upper wiring layer and the lower wiring layer are separated by an insulating layer group, the insulating layer group comprises an insulating sub-layer and an insulating organic compensator formed on the insulating sub-layer;
the insulating organic compensator covers the insulating sub-layer; and
the lower wiring layer comprises a first wiring sub-layer, a second wiring sub-layer, and an insulating interlayer configured to separate the first wiring sub-layer and the second wiring sub-layer;
wherein a first recess area is formed between a partial area of the insulating interlayer and the second wiring sub-layer, a second recess area is formed in a partial area of the upper surface of the insulating sub-layer, and the insulating organic compensator comprises a filling part filled in the second recess area; and
wherein the insulating sub-layer covers the insulating interlayer, the first recess area and the second wiring sub-layer, and the second recess area is formed at a part of the insulating sub-layer corresponding to the first recess area.

2. The array substrate according to claim 1, wherein the insulating organic compensator is organic adhesive.

3. The array substrate according to claim 2, wherein the organic adhesive is polyimide adhesive or acrylate diester anaerobic adhesive.

4. The array substrate according to claim 1, wherein the insulating organic compensator covers an entirety or a part of the upper surface of the insulating sub-layer.

5. The array substrate according to claim 1, wherein the first wiring sub-layer and a gate layer of the display area are disposed in a same layer, and the insulating interlayer and a gate insulating layer of the display area are disposed in a same layer.

6. The array substrate according to claim 1, wherein the insulating interlayer covers the first wiring sub-layer, and a protrusion is formed at a part corresponding to the first wiring sub-layer, and the first recess area is formed between the protrusion and the second wiring sub-layer.

7. The array substrate according to claim 6, wherein the insulating sub-layer further comprises a flat area located at a periphery of the second recess area, and the insulating organic compensator further comprises a flat sub-layer extending to a surface of the flat area.

8. The array substrate according to claim 1, wherein the insulating sub-layer comprises a first dielectric layer and a second dielectric layer which are laminatedly disposed.

9. The array substrate according to claim 1, wherein the insulating sub-layer is a two-layer lamination comprising a silicon oxide layer and a silicon nitride layer.

10. The array substrate according to claim 1, wherein the array substrate comprises a fan out area on the one side of the display area, and the wiring area is located in the fan out area.

11. The array substrate according to claim 10, wherein a film layer of the fan out area and a corresponding film layer of the display area are disposed in a same layer.

12. A display screen, comprising a chip and the array substrate according to claim 1.

13. The array substrate according to claim 1, further comprising a bending area, a pad area, and a fan out area which are located beneath the display area.

14. The array substrate according to claim 13, wherein the fan out area comprises a first fan out area and a second fan out area which are spaced apart, and at least one of the bending area and the pad area is disposed between the first fan out area and the second fan out area.

15. The array substrate according to claim 14, wherein both the bending area and the pad area are disposed between the first fan out area and the second fan out area.

16. The array substrate according to claim 1, wherein the first wiring sub-layer comprises multiple first wirings arranged with equal spacing and parallel to each other on the array substrate.

17. The array substrate according to claim 1, wherein the second wiring sub-layer comprises multiple second wirings arranged with equal spacing and parallel to each other on the insulating interlayer.

* * * * *